United States Patent [19]

Ronchi

[11] Patent Number: 4,903,165
[45] Date of Patent: Feb. 20, 1990

[54] PROCESS AND APPARATUS FOR MANUFACTURING METALLIZED FILMS FOR ELECTRIC CAPACITORS AND PRODUCTS THUS OBTAINED

[75] Inventor: Pietro Ronchi, Vimercate, Italy

[73] Assignee: Metalvuoto Films S.p.A., Bellusco, Italy

[21] Appl. No.: 334,954

[22] PCT Filed: Jul. 31, 1987

[86] PCT No.: PCT/IT87/00076

§ 371 Date: Mar. 24, 1989

§ 102(e) Date: Mar. 24, 1989

[87] PCT Pub. No.: WO88/00984

PCT Pub. Date: Feb. 11, 1988

[30] Foreign Application Priority Data

Aug. 1, 1986 [IT] Italy .................. 21386 A/86

[51] Int. Cl.$^4$ .............. H01G 1/01; H01G 7/00; B32B 15/08

[52] U.S. Cl. .................... 361/305; 29/25.42; 428/626

[58] Field of Search .......... 361/304, 305; 29/25.42; 428/626

[56] References Cited

U.S. PATENT DOCUMENTS

| | | | |
|---|---|---|---|
| 2,968,583 | 1/1961 | Barth | 428/626 |
| 3,179,862 | 4/1965 | Dubilier | 361/305 |

FOREIGN PATENT DOCUMENTS

| | | |
|---|---|---|
| 1006692 | 4/1957 | Fed. Rep. of Germany . |
| 2359431 | 6/1975 | Fed. Rep. of Germany . |
| 2359432 | 6/1975 | Fed. Rep. of Germany . |
| 842019 | 6/1939 | France . |
| 1469396 | 2/1967 | France . |
| 1534681 | 8/1968 | France . |
| 57-137462 | 8/1982 | Japan . |
| 759511 | 10/1956 | United Kingdom . |
| 974667 | 11/1964 | United Kingdom . |

OTHER PUBLICATIONS

"Condensateurs a Dielectriques Plastiques Metallises a L'Aluminium et au Zinc", *L'Onde Electrique*, vol. 48, No. 493, Apr. 1968, by M. Braguier, pp. 358–365.

"Silver Coating by Vacuum Evaporation", *Chemical Abstracts*, vol. 92, No. 8, Feb. 1980, Abstract 63294u, by S. Horii et al., p. 291.

"Vacuum Coating of Large Areas", *Thin Solid Films*, vol. 96, No. 3, Oct. 1982, by S. Schiller et al., pp. 199–216.

*Primary Examiner*—Donald A. Griffin
*Attorney, Agent, or Firm*—Young & Thompson

[57] ABSTRACT

The formation of three layers of overlapped metals having different thicknesses is provided on a dielectric film, these layers being a very thin layer of silver, copper or their alloys, a second zinc layer provided with a reinforcement and a third layer of aluminium or aluminium alloy comprising a percentage of titanium, silicon or cadmium lower than 1%. The layers are obtained by depositing metal vapours in a chamber at a pressure of about $10^{-4}$ torr. The apparatus comprises a vacuum chamber (10) divided in two sections (11 and 12), section (11) being a film's transit area, while in section (12) separate evaporating devices for the three metals are foreseen. Particularly, a resistive bar is foreseen for melting silver, copper or their alloys, a radiation furnace for zinc and a heated cylindric bar for aluminium or aluminium alloys.

14 Claims, 3 Drawing Sheets

PROCESS AND APPARATUS FOR MANUFACTURING METALLIZED FILMS FOR ELECTRIC CAPACITORS AND PRODUCTS THUS OBTAINED

The present invention relates to a process and an apparatus for the production of metallized films for electric capacitors as well as the products thus obtained.

Process for making capacitor's film are known; they foresee the deposit of a double metallic layer on a dielectric means. These double layers aim to make up for the inconveniences of one of the two meals with the qualities of the other. In fact the aluminium has a good conductivity but since it easily ionizes, it produces aluminium oxide that is a bad conductor; on the other hand zinc, having in its oxide a good conductor, requires a considerable thickness for assuring a good conductivity thus increasing the risk of short circuits between the two armatures with consequent overheating that can cause bursts and fires.

The processes for depositing the mentioned layers are complicated; to be carried out they necessitate very expensive equipments; furthermore, the resulting metallized film does not reach an optimized duration and capacitor self-regeneration.

U.S. Pat. No. 3,179,862 foresees the application in a single pass of two layers: one of zinc and one of aluminium.

The magazine "L'ONDE ELECTRIQUE" Vol. 48 No. 493, April 1968, pages 358-365 suggests at 359, third paragraph, to make a preliminary deposit of a very thin metallic layer (for example Ag) on a film of dielectric material.

"THIN SOLID FILMS" Vol. 96 No. 3, October 1982, pages 199-215 describes in a general way the uniform coating of large areas of flat glass, paper and plastic obtained with a single layer of metal.

Main object of this invention is to manufacture in a simple and cheap way metallized films for capacitors having a long service life.

The above mentioned aim has been reached as described in claims 1, 5, 12 and 14.

Other adventageous solutions are described in claims 2-4, 6-11 and 13.

An extremely layer of silver, copper or their alloys, then zinc having an uneven thickness and at least a layer or aluminium or aluminium alloys comprising a percentage of titanium, silicon or cadmium lower than 1% with uniform thickness are deposited on a dielectric film, the latter being placed in a chamber at an absolute pressure of about $10^{-4}$ torr ($1,3.10^{-2}$ Pa).

With this process, the possibility is also foreseen of adjusting the thickness of each layer, maintaining the thickness of aluminium or aluminium alloys at a value being from $\frac{1}{8}$ to 1/16 of the zinc's thickness.

An apparatus comprising a vacuum chamber divided in at least two sections is provided for carrying out the described process. In a first section an absolute pressure of about $10^{-2}$-$10^{-3}$ torr (1,3-0,13 Pa) is maintained; in a second section an absolute pressure of about $10^{-4}$ torr. ($1,3.10^{-2}$ Pa) is maintained. A $10^{-4}$ torr ($1,3.10^{-2}$ Pa) pressure is that necessary to obtain the evaporation of aluminium or its alloys at the temperature of $1400°°C$. Particularly the metal layers deposit takes place in the section at a pressure of about $10^{-4}$ torr($1,3.10^{-2}$ Pa). The section at a pressure of $10^2$-$10^{-3}$ torr (1,3-0,13 Pa) acts as a transit chamber for the film. For the deposit of silver, copper or their alloys and zinc a pressure higher than $10^{-4}$ torr ($1,3.10^{-2}$ Pa) would be sufficient but, for operational reasons, all the metal deposits are effected at the same pressure i.e. at about $10^{-4}$ torr.($1,3.10^{-2}$ Pa)

The apparatus comprises the means to bring the mentioned metals to the vapour state in separate and different devices, and means to maintain the necessary depression in the apparatus.

The evaporation of silver, copper or their alloys is obtained by putting small quantities of the metal, preferably metal tablets, in housings made in a resistive bar heated at a temperature comprised between 850° and 950° C. The vapour thus obtained reaches the film that runs on a rotating drum; the metal deposited in a thin layer allows a uniform deposit of the following layer. The film with said first layer continues towards the zone where it receives the second layer. A peripheral edge is left uncovered on the film to facilitate the following manufacture.

The evaporation of the zinc which will make up the second layer, is obtained by putting some zinc rods in a crucible that is heated by radiation at a temperature of about 600°-650° C. by means of a series of electric resistors surrounding it. The crucible is placed in a furnace in the inside walls of which the electric resistors are placed. The zinc vapour comes out from an opening placed at the top of the furnace where a steel screen is placed having a particular shape defining the metal reinforced areas, i.e. those areas on which a major metal thickness must be deposited. To avoid the dispersion of zinc vapours inside the vacuum chamber, it is necessary to provide a system allowing the furnace containing the crucible to approach the film when the metalizing process starts. Furthermore to obtain an optimized distribution of particles and to avoid incandescent zinc particles hitting the film, the vapours flow through openings placed sideways with respect to the screen.

After passing near the zinc vapours the film reaches the aluminium or aluminium alloys, evaporation area. An aluminium or aluminium alloy wire wound on a spool, is fed to a heated bar having a temperature of about 1400° C. reached by means of electric current where it fuses. At the existing pressure of about $10^{-4}$ torr ($1,3.10^{-2}$ Pa), the melted metal evaporates and deposits on the film.

The film coming out of the apparatus is provided with three overlapped layers of different metals, precisely, a first extremely thin layer of silver, copper or their alloys, a second zinc layer having suitable reinforced areas and a third aluminium or aluminium alloy layer having an even thickness. The metallized film is made preferably with a double width and is provided with a central reinforced area and with two peripheral free edges. By cutting the film along its longitudinal axis at the center of the reinforced area, two symmetrical strips of metallized film are obtained, both provided with a peripheral free edge on one side and a reinforced area on the other.

The process steps and the apparatus for their execution, according to a preferred but not restrictive embodiment are shown in the enclosed drawings in which.

Figure 1:
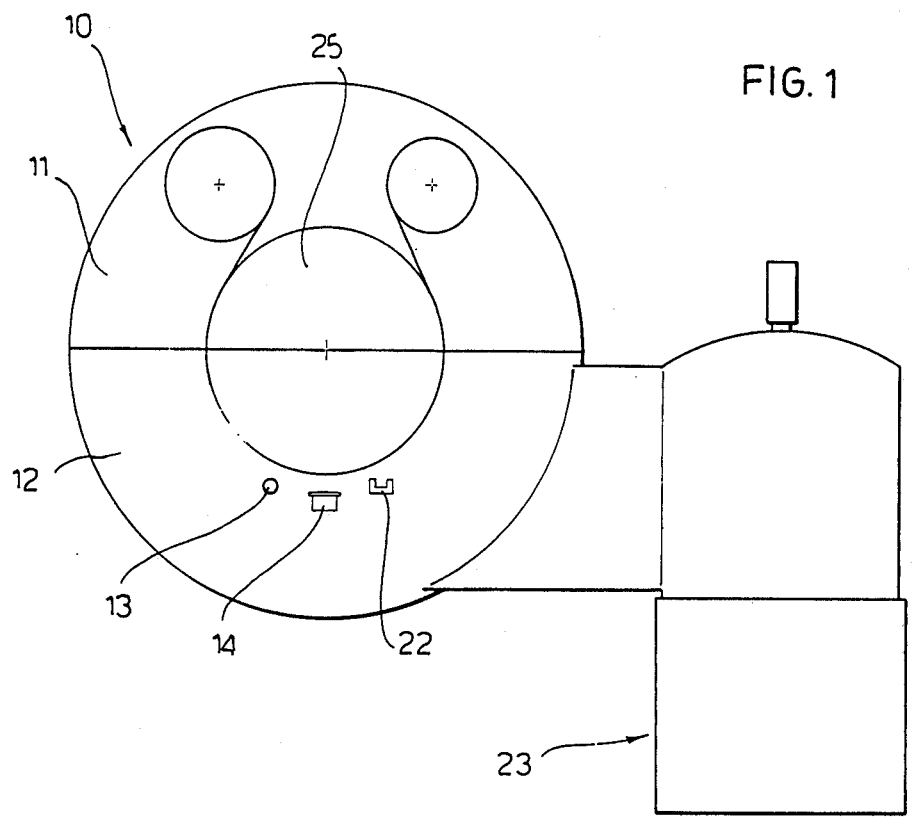
FIG. 1 is a schematic side view of the whole apparatus.

FIG. 1 shows schematically the whole device comprising a vacuum chamber 10 divided in two sections 11 and 12, section 11 being at an absolute pressure of about $10^{-2}$–$10^{-3}$ (1,3-0,13 Pa) torr and section 12 at an absolute pressure of about $10^{-4}$ (1,3.$10^{-2}$ Pa) torr. A rotating drum 25 is placed centrally in the vacuum chamber. On its surface the film runs.

Section 12 comprises all the equipment necessary to bring the three metals to vapour state. For the evaporation of silver, copper or their alloys a small resistive bar 13 is foreseen provided with housings for receiving small quantities of metal to be melted. For the zinc evaporation a furnace 14 in welded stainless steel is provided in the middle of which a crucible 15 is placed. Zinc rods are placed in crucible 15. The melting takes place by means of heat radiation provided by means of electric resistors 16 surrounding the inside wall of furnace 14. In the top part of the latter a screen 17 is placed. The openings 18 oblige the particles to follow an indirect curvilinear path which protects the film fron zinc particles coming directly from the crucible 15.

Figure 3:
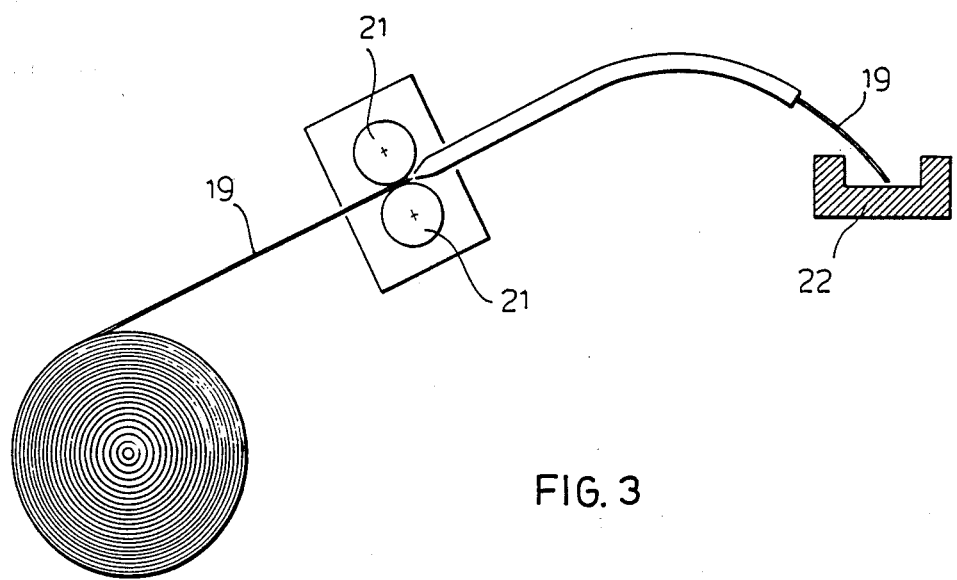
FIG. 3 is a view of the aluminium or aluminium alloy evaporating device.
Figure 2:
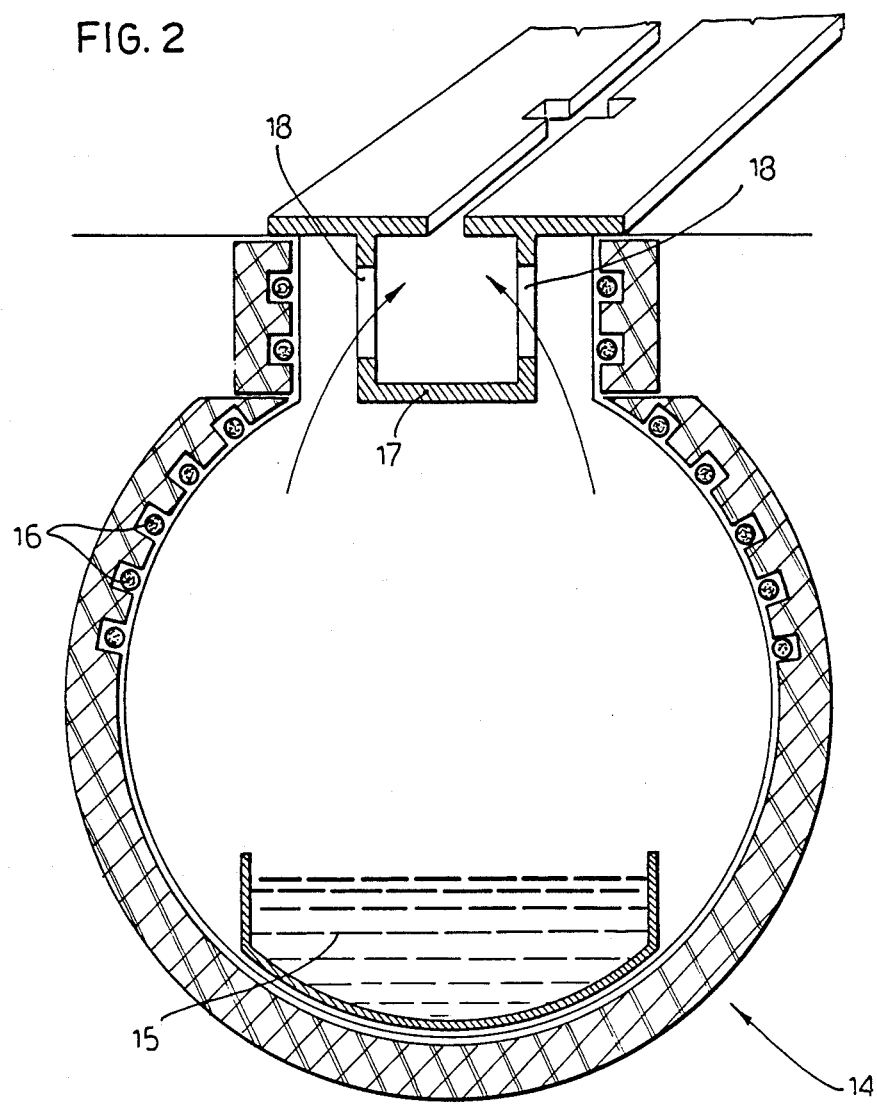
FIG. 2 is a view of the zinc evaporating furnace.

The evaporation of aluminium or aluminium alloys, a shown in FIG. 3, takes place by melting this metal. Crucible 22 is fed by an aluminium or aluminium alloy wire 19 wound on a spool 20. Wire 19 is drawn by rods 21. Drownstream from these rollers wire 19 follows a path having a single concavity, i.e. a run without double bends.

Figure 4:
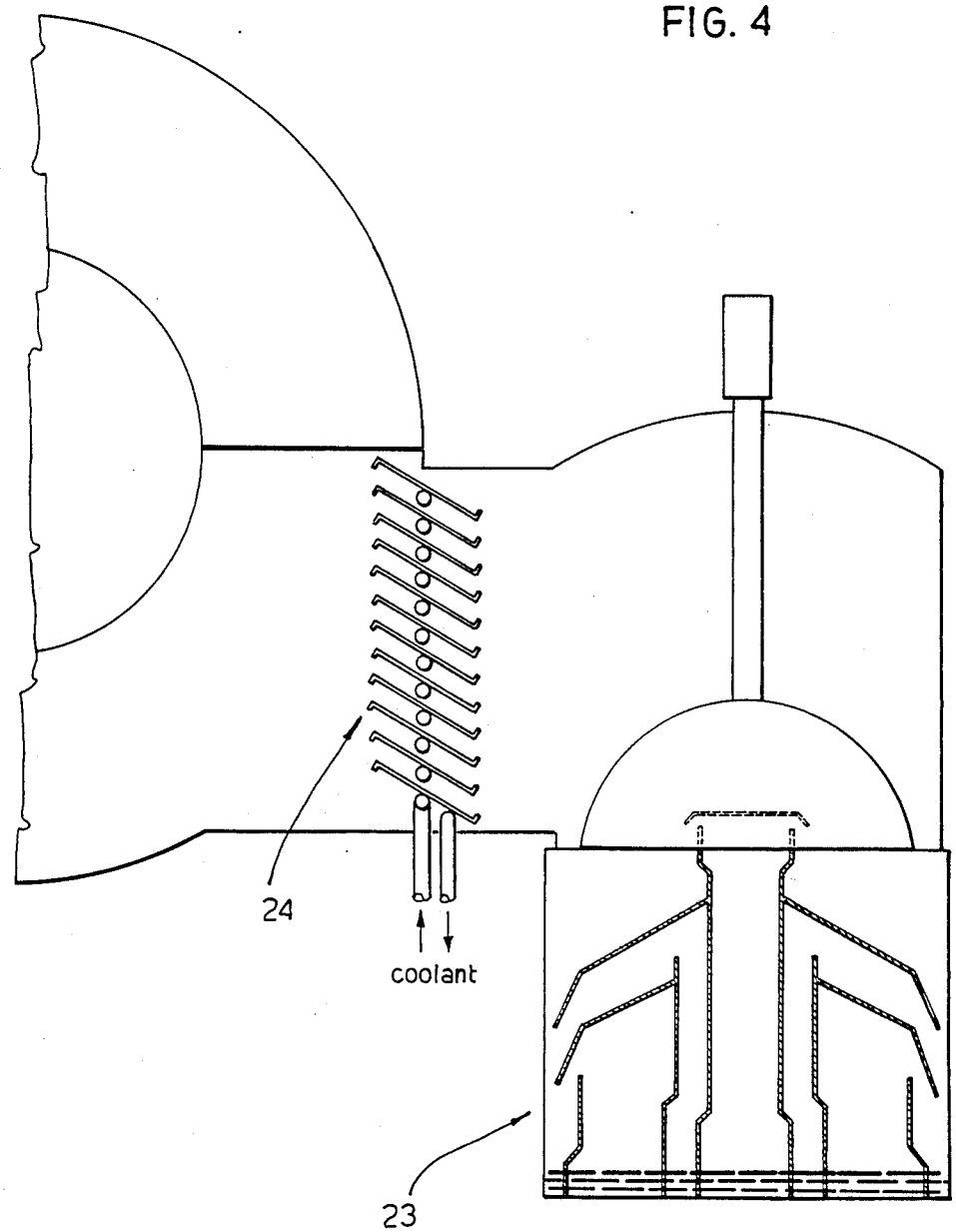
FIG. 4 is a view of the zinc vapours retaining device placed at the oil pump's entrance.

Depression in section 12 is obtained by means of an oil vacuum pump 23. Therefore it is necessary that the vapours produced are not intaken by the pump, because they alter the oil quality damaging the pump. A device 24 (FIG. 4) is thus provided to intercept and retain the vapours. It is made up of refrigerated panels which catch the metal vapours. These panels are normally water-chilled. On their surface the vapours condense and may be collected.

Section 11 having an absolute pressure of $10^{-2}$–$10^{-3}$ torr (1,3-0,13 Pa) acts as a transit chamber for the film. The depression in this section is maintained by means of further pumps (not shown). When the apparatus is starting up these pumps perform the duty of bringing both the sections 11 and 12 to the absolute pressure of about $10^{-2}$–$10^{-3}$ torr (1,3-0,13 Pa). In section 12 oil pump 23 will then lower the pressure to the value of about $10^{-4}$ torr.(1,3.$10^{-2}$ Pa)

Figure 5:
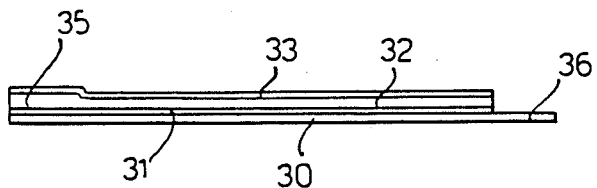
FIG. 5 is an enlarged sectional view of a metallized film portion.

In FIG. 5 an enlarged section of a metallized film strip is shown, said strip being obtained, for instance, by cutting in half a double film. On dielectric film 30 a first very thin layer 31 of silver, copper or their alloys is laid without covering the peripheral free edge 36. On the layer 31 a zinc layer 32 is placed provided with a reinforced area 35 along the other peripheral edge. At last, on the zinc layer, a layer 33 in aluminium or aluminium alloy comprising a percentage of titanium, silicon or cadmium smaller than 1% is laid. Zinc layer 32 is the thickest layer; preferably the following aluminium or aluminium alloy layer has a thickness comprised between ⅛ and 1/16 of the zinc's layer.

I claim:

1. A process for making metallized films for electric capacitors according to which three overlapped metal layers are deposited on a film of dielectric material, wherein the film is caused to pass through a chamber at a pressure of about $10^{-4}$ torr (1,3.$10^{-2}$ Pa); in front of said film three different vapour sources are arranged in succession one after the other, the first one vaporizing silver, copper or their alloys; the second one zinc; and the third one aluminium or aluminium alloys together with less than 1% of titanium, silicon or cadmium so as to form, on said film, three overlapped layers the first of which is thinner than the second one, and wherein at least a peripheral edge (36) is left uncovered.

2. A process as in claim 1, characterized in that a zinc layer (32) is formed so as to comprise suitable reinforced areas (35).

3. A process as in claim 1, characterized in that the thickness of aluminium or aluminium alloy layer (31) varies between ⅛ and 1/16 of the thickness of the zinc layer (32).

4. A process as in claim 1, characterized in that a film is produced with a double width and a reinforced area (35) in its center, then this film is cut along the longitudinal axis passing from the center of the reinforced area (35) to obtain two strips both being provided with a peripheral free edge (36) along one side and with a reinforced area (35) along the other.

5. An apparatus for making a metallized film for electric capacitors, characterized in that it comprises a vacuum chamber (10) divided in two sections (11 and 12) the first section (11) being at a pressure of $10^{-2}$–$10^{-3}$ torr (1,3- 0,13 Pa) and the second section (12) at a pressure of $10^{-4}$ torr (1,3.$10^{-2}$ Pa); in the second section (12) three separate melting devices are placed in succession one after the other, for evaporating at first silver, copper or their alloys, then zinc and at least aluminium or aluminium alloys comprising a percentage of titanium, silicon or cadmium lower than 1%, the depression being maintained in the first section (11) by means of mechanical pumps and in the section section (12) by means of an oil pump (23).

6. An apparatus as in claim 5, characterized in that a rotating drum (25) is placed in the center of vacuum chamber (10) for the film to slide forward.

7. An apparatus as in claim 5, characterized in that the melting device for silver, copper or their alloys comprises a resistive bar (13) which can be heated at a temperature of 850° C.-950° C., provided with housings to receive small quantities of metal to be melted.

8. An apparatus as in claim 5, characterized in that the zinc melting device is a furnace (14) in which a crucible (15) is placed wherein zinc rods can be melted at a temperature of 600°-650° C. by the heat radiated from electric resistors (16) placed around the inside wall of the furnace (14), the furnace top being provided with a screen (17) having side openings (18) avoiding the zinc particles to directly reach the film with a straight path.

9. An apparatus as in claim 8, characterized in that the screen (17) is shaped so as to have reinforced areas (35) in the zinc layer (32).

10. An apparatus as in claim 5, characterized in that the melting device for aluminium or aluminium alloy, comprising a percentage of titanium, silicon or cadmium lower than 1%, comprises a small bar (21) which can be heated at temperature of about 1400° C. which provide for the fusion of a wire (19) that is wound on a spool (20), the metal being melted in a crucible (22).

11. An apparatus as in claim 5, characterized in that the oil pump (23) is provided at its inlet with panels (24) which retain the metal vapours, these panels being refrigerated and placed so as to be hitten by the metal particles on their way towards the oil pump, these particles condensing on them thus leaving the pump's oil clean.

12. A metallized film comprising three layers of different material laid on a dielectric film, the first layer (31) being silver, copper or their alloys, which is thinner than the second (32) one which is a layer of zinc and the third (33) a layer of aluminium or aluminium alloy, comprising a percentage of titanium, silicon or cadmium lower than 1%, and in that it has uncovered peripheral edges (36).

13. A metallized film as in claim 12, characterized in that the zinc layer (32) is provided with a reinforced peripheral areas (35) and the aluminium or the aluminium alloy layer (33) has a thickness varying from $\frac{1}{8}$ and 1/16 with respect to the zinc layer (32).

14. Capacitors comprising a metallized film according to claim 12.

* * * * *